(12) United States Patent
Jeong

(10) Patent No.: US 8,120,053 B2
(45) Date of Patent: *Feb. 21, 2012

(54) SEMICONDUCTOR LIGHT EMITTING DEVICE

(75) Inventor: Hwan Hee Jeong, Ulsan (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/034,376

(22) Filed: Feb. 24, 2011

(65) Prior Publication Data

US 2011/0140158 A1  Jun. 16, 2011

Related U.S. Application Data

(63) Continuation of application No. 13/014,530, filed on Jan. 26, 2011, now Pat. No. 8,022,428, which is a continuation of application No. 12/426,491, filed on Apr. 20, 2009, now Pat. No. 7,947,997.

(30) Foreign Application Priority Data

Apr. 21, 2008 (KR) ........................ 10-2008-0036876

(51) Int. Cl.
*H01L 33/00* (2010.01)
(52) U.S. Cl. .................. 257/98; 257/E33.064
(58) Field of Classification Search .................. 257/98, 257/E33.064
See application file for complete search history.

(56) References Cited

U.S. PATENT DOCUMENTS

| 7,183,586 | B2 | 2/2007 | Ichihara et al. |
| 2005/0199895 | A1 | 9/2005 | Seong et al. |
| 2007/0034892 | A1 | 2/2007 | Song |
| 2008/0303055 | A1 | 12/2008 | Seong |
| 2009/0124030 | A1 | 5/2009 | Seong et al. |
| 2010/0124797 | A1 | 5/2010 | Lee |

FOREIGN PATENT DOCUMENTS

| CN | 1677703 A | 10/2005 |
| EP | 1 523 047 A2 | 4/2005 |
| JP | 2006-13034 A | 1/2006 |
| JP | 2006-203058 A | 8/2006 |
| JP | 2007-158128 A | 6/2007 |
| KR | 10-2002-0026619 A | 4/2002 |
| KR | 10-2007-0081482 A | 8/2007 |
| KR | 10-0812736 B1 | 3/2008 |
| WO | WO 2007/074969 A1 | 7/2007 |

*Primary Examiner* — Trung Q Dang
(74) *Attorney, Agent, or Firm* — Birch, Stewart, Kolasch & Birch, LLP

(57) ABSTRACT

Disclosed is a semiconductor light emitting device. An embodiment of the semiconductor light emitting device includes a first conductive semiconductor layer, an active layer under the first conductive semiconductor layer, a second conductive semiconductor layer under the active layer, a second electrode layer under the second conductive semiconductor layer, and a transmissive conductive layer at least one part between the second conductive semiconductor layer and the second electrode layer.

15 Claims, 5 Drawing Sheets

SEMICONDUCTOR LIGHT EMITTING DEVICE

This application is a continuation of application Ser. No. 13/014,530, filed on Jan. 26, 2011 now U.S. Pat. No. 8,022, 428, which is a continuation of application Ser. No. 12/426, 491, filed on Apr. 20, 2009, now U.S. Pat. No. 7,947,997 which claims priority to Korean Patent Application No. 10-2008-0036876, filed on Apr. 21, 2008. The entire contents of each of these applications are hereby incorporated by reference.

BACKGROUND

The present disclosure relates to a semiconductor light emitting device.

Groups III-V nitride semiconductors have been variously applied to an optical device such as blue and green Light Emitting Diodes (LED), a high speed switching device, such as a metal semiconductor field effect transistor (MOSFET) and a hetero junction field effect transistor (HEMT), and a light source of a lighting device or a display device.

The nitride semiconductor is mainly used for LEDs or laser diodes (LDs), and studies have been continuously conducted to improve the manufacturing process or light efficiency of the nitride semiconductor.

SUMMARY

The embodiment provides a semiconductor light emitting device comprising a transmissive conductive layer at an outer portion between a compound semiconductor layer and a second electrode layer.

The embodiment provides a semiconductor light emitting device comprising an ohmic contact layer at an inner portion between a compound semiconductor layer and a second electrode layer.

The embodiment provides a semiconductor light emitting device comprising an ohmic contact layer having a plurality of patterns between a compound semiconductor layer and a second electrode layer.

An embodiment provides a semiconductor light emitting device comprising: a first conductive semiconductor layer; an active layer under the first conductive semiconductor layer; a second conductive semiconductor layer under the active layer; a second electrode layer under the second conductive semiconductor layer; and a transmissive conductive layer at least one part between the second conductive semiconductor layer and the second electrode layer.

An embodiment provides a semiconductor light emitting device comprising: a light emitting structure comprising a first conductive semiconductor layer, an active layer and the second conductive semiconductor layer; a second electrode layer under a second conductive semiconductor layer; and a transmissive conductive layer at an outer portion on the second electrode layer.

An embodiment provides a semiconductor light emitting device comprising: a light emitting structure comprising a plurality of compound semiconductor layers; a second electrode layer under the light emitting structure; and a transmissive conductive layer at an outer portion between the second electrode layer and the light emitting structure.

DETAILED DESCRIPTION OF THE EMBODIMENTS

Figure 1:
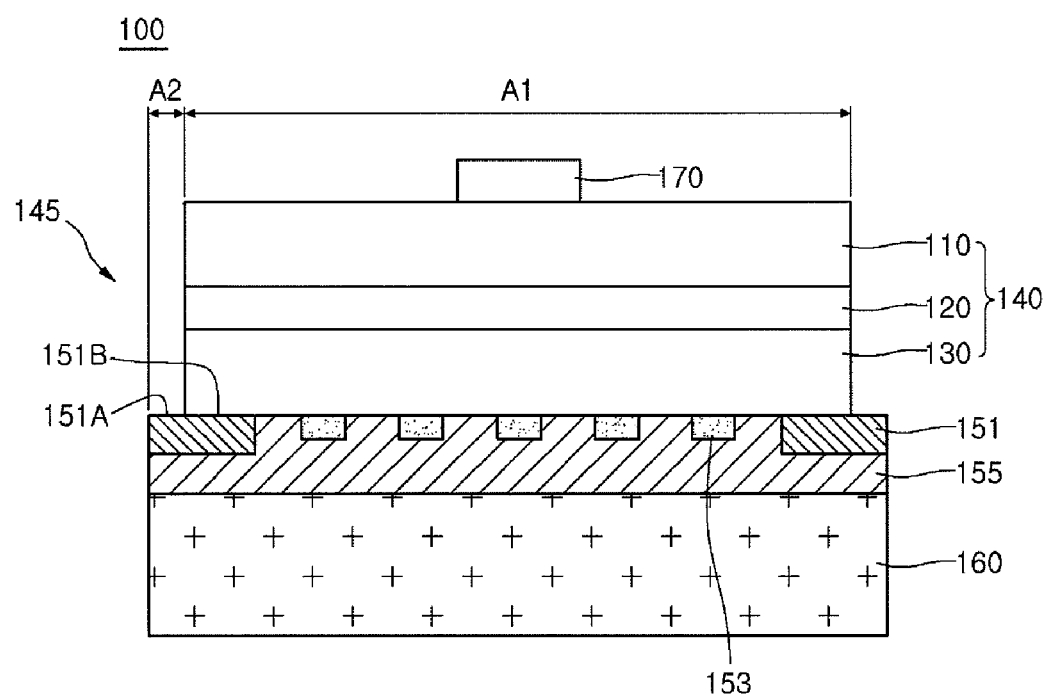
FIG. 1 is a side sectional view showing a semiconductor light emitting device according to an embodiment.

Hereinafter, a semiconductor light emitting device according to an embodiment will be described with reference to the accompanying drawings. In the description of the embodiment, the term "on" or "under" of each layer will be described with reference to the accompanying drawings and thickness of each layer is not limited to thickness shown in the drawings. In the description of an embodiment, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present.

FIG. 1 is a side sectional view showing a semiconductor light emitting device according to an embodiment.

Referring to FIG. 1, the semiconductor light emitting device 100 comprises a first conductive semiconductor layer 110, an active layer 120, at least one second conductive semiconductor layer 130, a transmissive conductive layer 151, an ohmic contact layer 153, a second electrode layer 155, a conductive support member 160 and a first electrode layer 170.

The semiconductor light emitting device 100 comprises a light emitting diode (LED) chip using an III-V group compound semiconductor. The LED chip may comprise a colored LED, which emits blue light, green light or red light, or a UV (ultraviolet) LED. The emission light of the LED chip can be variously embodied within the scope of the embodiment.

The first conductive semiconductor layer 110 may comprise one selected from the group consisting of GaN, AlN, AlGaN, InGaN, InN, InAlGaN, AlInN, AlGaAs, GaP, GaAs and GaAsP, which are compound semiconductors of III-V group elements doped with a first conductive dopant.

When the first conductive semiconductor layer 110 is an N type semiconductor layer, the first conductive dopant comprises an N type dopant such as Si, Ge, Sn, Se or Te. The first conductive semiconductor layer 110 may function as an electrode contact layer, and may have a single layer or a multilayer. The embodiment is not limited thereto.

The first electrode layer 170 is formed on the first conductive semiconductor layer 110 to receive power of a first polarity. The first conductive semiconductor layer 110 may be provided thereon with a roughness surface having a predetermined shape. The roughness surface can be added or modified within the scope of the embodiment.

The active layer 120 is formed under the first conductive semiconductor layer 110 and may have a single quantum well structure or a multi-quantum well structure. The active layer 120 may have an arrangement of a well layer and a barrier layer by using compound semiconductor materials of the III-V group elements. For example, the active layer 120 may have an arrangement of an InGaN well layer and a GaN barrier layer or an arrangement of an AlGaN well layer and a GaN barrier layer.

The active layer 120 comprises material having bandgap energy according to wavelength of emitted light. The active layer 120 may comprise material that emit chromatic light such as light having a blue wavelength, light having a red wavelength, and light having a green wavelength. The embodiment is not limited thereto. A conductive clad layer may be formed on and/or under the active layer 120 and may comprise an AlGaN layer.

The second conductive semiconductor layer 130 is formed under the active layer 120. The second conductive semiconductor layer 130 may comprise one selected from the group consisting of GaN, AlN, AlGaN, InGaN, InN, InAlGaN, AlInN, AlGaAs, GaP, GaAs, GaAsP, which are compound semiconductors of III-V group elements doped with a second conductive dopant. When the second conductive semiconductor layer 130 is a P type semiconductor layer, the second conductive dopant comprises a P type dopant such as Mg and Ze. The second conductive semiconductor layer 130 may function as an electrode contact layer. The embodiment is not limited thereto.

The first conductive semiconductor layer 110, the active layer 120 and the second conductive semiconductor layer 130 can be defined as a light emitting structure 140. The first conductive semiconductor layer 110 may be provided as a P type semiconductor layer and the second conductive semiconductor layer 130 may be provided as an N type semiconductor layer. A third conductive semiconductor layer, for example, an N type or P type semiconductor layer, may be formed under the second conductive semiconductor layer 130. Thus, the light emitting structure 140 may comprise at least one of an N-P junction structure, a P-N junction structure, an N-P-N junction structure and a P-N-P junction structure.

The transmissive conductive layer 151, the ohmic contact layer 153 and the second electrode layer 155 are formed under the second conductive semiconductor layer 130.

An inner part 151B of the transmissive conductive layer 151 is formed on an outer interface between the second conductive semiconductor layer 130 and the second electrode layer 155 to widen an effective area of a light emitting area A1, so that light emitting efficiency can be improved. An outer part 151A of the transmissive conductive layer 151 is formed on an outer channel area 145 of the light emitting structure 140. The channel area 145 can be defined as a groove formed by etching an outer wall of the light emitting structure 140.

The outer part 151A of the transmissive conductive layer 151 is disposed on a non-light emitting area A2 or the channel area 145 to improve electrical reliability at the outer wall of the light emitting structure 140.

The transmissive conductive layer 151 may have a ring shape, a frame shape or a band shape along an outer peripheral surface of the second conductive semiconductor layer 130.

The transmissive conductive layer 151 comprises at least one selected from the group consisting of indium tin oxide (ITO), indium zinc oxide (IZO), aluminum zinc oxide (AZO), indium zinc tin oxide (IZTO), indium aluminum zinc oxide (IAZO), indium gallium zinc oxide (IGZO), indium gallium tin oxide (IGTO) and antimony tin oxide (ATO).

The transmissive conductive layer 151 comprises non-metal material or metal oxide having light transmission and conductivity to prevent the second electrode layer 155 from exerting influence upon the light emitting structure 140.

Further, the transmissive conductive layer 151 can prevent the second electrode layer 155 from being exposed to the channel area 145 of the light emitting structure 140 by allowing laser irradiated during a manufacturing process (e.g. mesa etching process) of a chip to pass therethrough.

If an insulating layer (e.g. $SiO_2$), instead of the transmissive conductive layer 151, is formed on the channel area 145 of the light emitting structure 140, the insulating layer may be etched by the laser. Further, the second electrode layer 155 is exposed, so the short circuit may occur among the layers 110, 120 and 130 of the light emitting structure 140. Such a problem can be blocked using the transmissive conductive layer 151.

Further, the inner part 151B of the transmissive conductive layer 151 makes ohmic contact with the second conductive semiconductor layer 130 to improve the electrical properties and light emitting efficiency of the light emitting structure 140 as compared with the insulating layer.

The ohmic contact layer 153 is formed at an inner portion of a bottom surface of the second conductive semiconductor layer 130, and has a plurality of patterns. In the ohmic contact layer 153, the patterns having a cross, polygonal or circular shape can be arranged in a matrix type. The shape or arrangement type of the patterns can be variously modified with the scope of the embodiment.

The ohmic contact layer 153 may comprise one selected from the group consisting of ITO, IZO, AZO, IZTO, IAZO, IGZO, IGTO and ATO which are ohmic materials.

The transmissive conductive layer 151 may have thickness thinner than that of the second electrode layer 155, and the ohmic contact layer 153 may have thickness equal to or thinner than that of the transmissive conductive layer 151. For example, the transmissive conductive layer 151 may have thickness of about 1000 Å to about 8000 Å, and the ohmic contact layer 153 may have thickness of about 10 Å to about 2000 Å.

The ohmic contact layer 153 may comprise ohmic materials identical to those of the transmissive conductive layer 151, or ohmic materials different from each other.

The ohmic contact layer 153 is provided in the form of the patterns under the second conductive semiconductor layer 130 to improve adhesive force between the second conductive semiconductor layer 130 and the second electrode layer 155.

The second electrode layer 155 is formed under the second conductive semiconductor layer 130, the transmissive conductive layer 151 and the ohmic contact layer 153.

The second electrode layer 155 may comprise one selected from the group consisting of Ag, Ni, Al, Rh, Pd, Ir, Ru, Mg, Zn, Pt, Au and Hf and a combination thereof. The second electrode layer 155 can make Schottky contact with the second conductive semiconductor layer 130.

The second electrode layer 155 functions as an electrode that stably supplies power of a second polarity to the light emitting structure 140, and reflects light incident through the second conductive semiconductor layer 130, the ohmic contact layer 153 and the transmissive conductive layer 151.

The second electrode layer 155 makes Schottky contact with the second conductive semiconductor layer 130, and the ohmic contact layer 153 makes ohmic contact with the second conductive semiconductor layer 130. Thus, since the second electrode layer 155 has electrical properties different from that of the ohmic contact layer 153, electric current applied to the second conductive semiconductor layer 130 can be distributed.

The ohmic contact layer 153 may comprise metal oxide instead of transmissive material. When the second electrode layer 155 has ohmic and reflective characteristics, the ohmic contact layer 153 may be omitted.

The conductive support member 160 is formed under the second electrode layer 155, and may comprise copper, gold, nickel, molybdenum, copper-tungsten and carrier wafer such as Si, Ge, GaAs, ZnO and Sic.

The second electrode layer 155 and the conductive support member 160 can be used as a second electrode member that supplies the power of the second polarity to the light emitting structure 140.

FIGS. 2 to 9 are views showing the method of fabricating the semiconductor light emitting device according to the embodiment.

Figure 2:
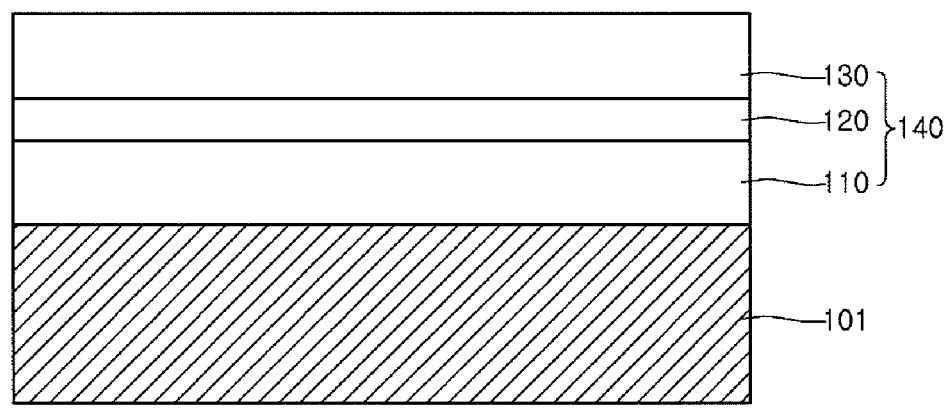
FIGS. 2 to 9 are views showing a method of fabricating a semiconductor light emitting device according to an embodiment.

Referring to FIG. 2, the light emitting structure 140 comprising a plurality of compound semiconductor layers laminated thereon is formed on a substrate 101. In the light emitting structure 140, the first conductive semiconductor layer 110, the active layer 120 and the second conductive semiconductor layer 130 can be sequentially laminated.

The substrate 101 may comprise one selected from the group consisting of $Al_2O_3$, GaN, SiC, ZnO, Si, GaP, InP and GaAs.

A III-V group compound semiconductor can be grown on the substrate 101 using growth equipment such as E-beam deposition equipment, physical vapor deposition (PVD) equipment, chemical vapor deposition (CVD) equipment, plasma laser deposition (PLD) equipment, a dual-type thermal evaporator, sputtering equipment and metal organic chemical vapor deposition (MOCVD) equipment. However, the embodiment is not limited thereto.

A buffer layer (not shown) and/or an undoped semiconductor layer may be formed on the substrate 101. The buffer layer may comprise a single crystalline buffer layer or an III-V group compound semiconductor to reduce a lattice constant difference from the substrate 101. The undoped semiconductor layer may comprise a GaN-based semiconductor layer.

At least one first conductive semiconductor layer 110 is formed on the substrate 101. The first conductive semiconductor layer 110 may comprise one selected from the group consisting of GaN, AlN, AlGaN, InGaN, InN, InAlGaN, AlInN, AlGaAs, GaP, GaAs and GaAsP, which are compound semiconductors of III-V group elements doped with the first conductive dopant. When the first conductive semiconductor layer 110 is an N type semiconductor layer, the first conductive dopant comprises an N type dopant such as Si, Ge, Sn, Se or Te.

The active layer 120 is formed on the first conductive semiconductor layer 110 and may have a single quantum well structure or a multi-quantum well structure. The active layer 120 may use material that emit chromatic light such as light having a blue wavelength, light having a red wavelength, and light having a green wavelength. The conductive clad layer may be formed on and/or under the active layer 120 and may comprise an AlGaN layer.

The second conductive semiconductor layer 130 is formed on the active layer 120. The second conductive semiconductor layer 130 may comprise one selected from the group consisting of GaN, AlN, AlGaN, InGaN, InN, InAlGaN, AlInN, AlGaAs, GaP, GaAs, GaAsP, which are compound semiconductors of III-V group elements doped with the second conductive dopant. When the second conductive semiconductor layer 130 is a P type semiconductor layer, the second conductive dopant comprises a P type dopant such as Mg and Ze.

The third conductive semiconductor layer, for example, an N type or P type semiconductor layer, may be formed on the second conductive semiconductor layer 130. Thus, the light emitting structure 140 may comprise at least one of an N-P junction structure, a P-N junction structure, an N-P-N junction structure and a P-N-P junction structure.

Figure 3:
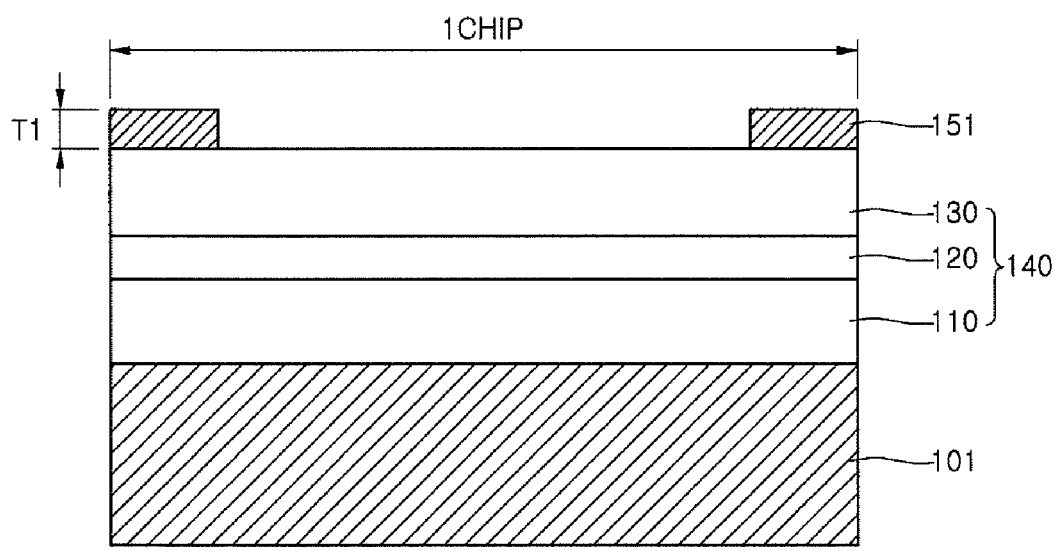

Referring to FIG. 3, the transmissive conductive layer 151 is formed on the outer portion of the top surface of the second conductive semiconductor layer 130. The transmissive conductive layer 151 may have a ring shape, a frame shape or a band shape along the outer surface of the second conductive semiconductor layer 130.

According to a process of forming the transmissive conductive layer 151, a mask layer is formed on the second conductive semiconductor layer 130, an area in which the transmissive conductive layer 151 is to be formed is etched, and then the transmissive conductive layer 151 is formed using a sputtering method. The process of forming the transmissive conductive layer 151 is one example and can be modified with the scope of the embodiment.

The transmissive conductive layer 151 comprises at least one selected from the group consisting of ITO, IZO, AZO, IZTO, IAZO, IGZO, IGTO and ATO.

The transmissive conductive layer 151 may have thickness T1 of about 1000 Å to about 8000 Å, which is equal to or thinner than that of the second electrode layer 155.

The inner part of the transmissive conductive layer 151 makes ohmic contact with the second conductive semiconductor layer 130 to improve the light emitting efficiency of the light emitting structure 140.

Figure 4:
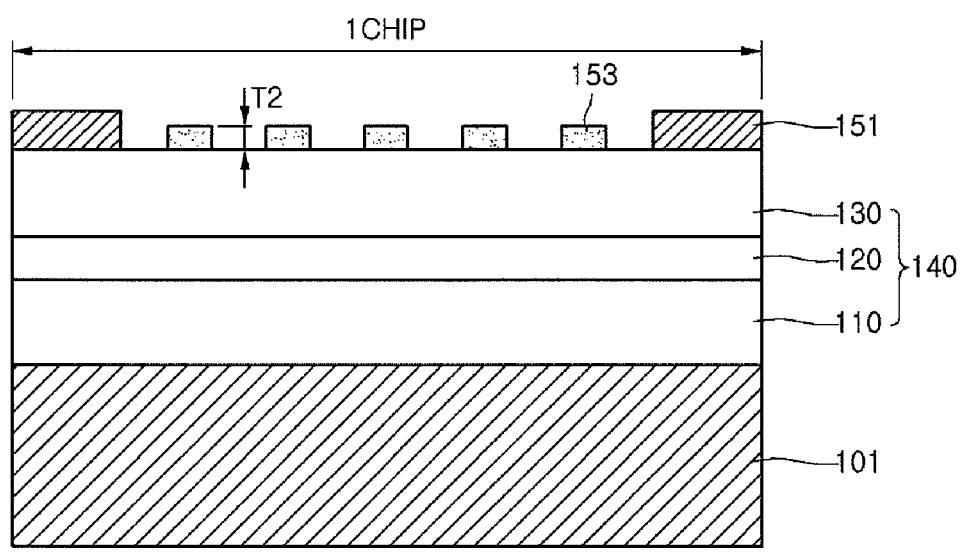

Referring to FIG. 4, the ohmic contact layer 153 is formed on the inner portion of the top surface of the second conductive semiconductor layer 130. The ohmic contact layer 153 is prepared in the form of plural patterns while making ohmic contact with the second conductive semiconductor layer 130.

According to a process of forming the ohmic contact layer 153, a mask layer is formed on the second conductive semiconductor layer 130 and the transmissive conductive layer 151, an area in which the ohmic contact layer 153 is to be formed is etched, and then the ohmic contact layer 153 is formed using a sputtering method. The process of forming the ohmic contact layer 153 is one example and can be modified with the scope of the embodiment.

In the ohmic contact layer 153, the patterns having a cross, polygonal or circular shape can be arranged in a matrix type. The shape or arrangement type of the patterns can be variously modified with the scope of the embodiment.

The ohmic contact layer 153 may comprise one selected from the group consisting of ITO, IZO, AZO, IZTO, IAZO, IGZO, IGTO and ATO, which are ohmic materials or metal oxide. Further, the ohmic contact layer 153 may comprise metal having ohmic properties, instead of transmissive materials.

The ohmic contact layer 153 may have thickness T2 of about 10 Å to about 2000 Å, which may be equal to or thinner than the thickness T1 of the transmissive conductive layer 151.

The ohmic contact layer 153 is provided in the form of the patterns on the upper surface of the second conductive semiconductor layer 130 to improve adhesive force between the second conductive semiconductor layer 130 and the second electrode layer 155. Further, the ohmic contact layer 153 is provided in the form of the patterns, the electric current can be distributed.

The ohmic contact layer 153 may comprise ohmic materials identical to those of the transmissive conductive layer 151, or ohmic materials different from each other. Further, the sequence in which the transmissive conductive layer 151 and the ohmic contact layer 153 are formed may be modified.

Figure 5:
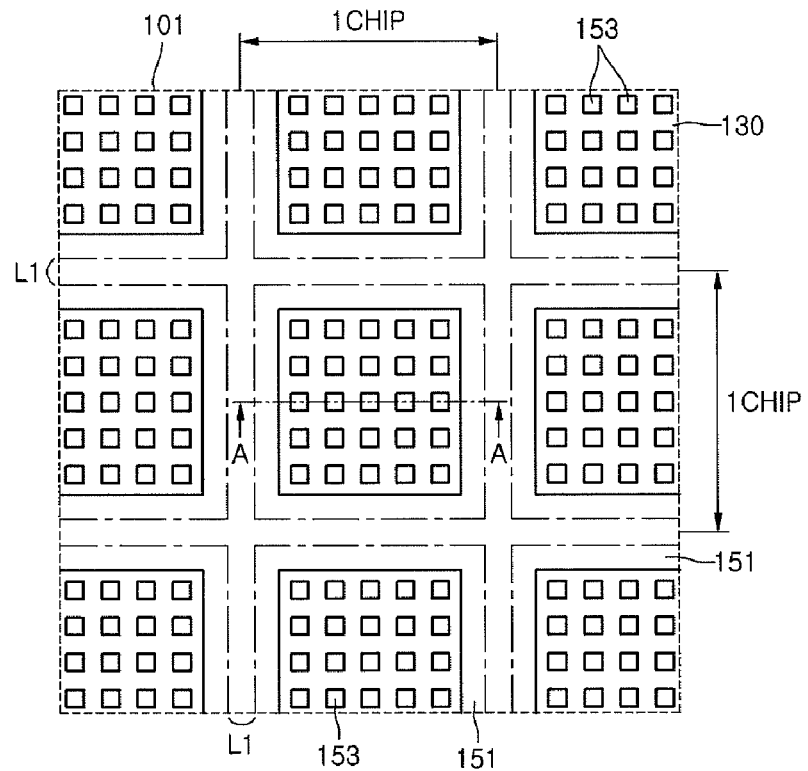

FIG. 5 is a plan view showing a plurality of chip areas on the substrate according to the embodiment.

Referring to FIGS. 3 and 5, the transmissive conductive layer 151 is formed along the outer peripheral surface of the second conductive semiconductor layer 130 on the basis of each chip. The transmissive conductive layer 151 extends from a boundary area L1 between the chips to a part of a light emitting area of each chip.

Referring to FIGS. 4 and 5, in each chip, the ohmic contact layer 153 is provided in the form of plural patterns on the inner portion of the top surface of the second conductive semiconductor layer 130. The second conductive semiconductor layer 130 is exposed to an area having no ohmic contact layer 153. FIG. 4 is a sectional view taken along A-A in FIG. 5.

Figure 6:
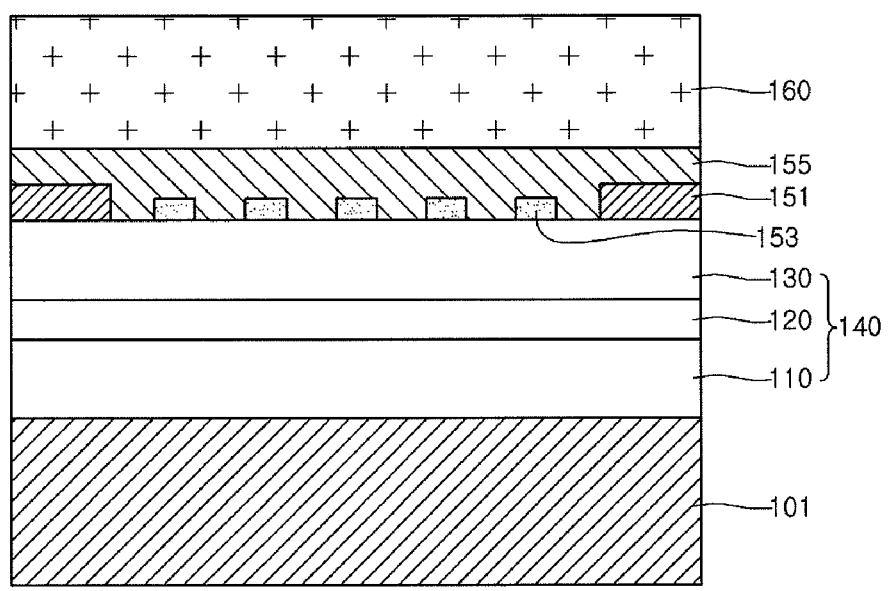

Referring to FIG. 6, the second electrode layer 155 is formed on the second conductive semiconductor layer 130, the transmissive conductive layer 151 and the ohmic contact layer 153, and the conductive support member 160 is formed on the second electrode layer 155.

The second electrode layer 155 may comprise one selected from the group consisting of Ag, Ni, Al, Rh, Pd, Ir, Ru, Mg, Zn, Pt, Au and Hf and a combination thereof. The second electrode layer 155 can make Schottky contact with the second conductive semiconductor layer 130. The second electrode layer 155 reflects light incident through the second conductive semiconductor layer 130, the ohmic contact layer 153 and the transmissive conductive layer 151.

The second electrode layer 155 functions as the electrode that stably supplies the power of the second polarity to the light emitting structure 140. Further, the second electrode layer 155 makes Schottky contact with the second conductive semiconductor layer 130, and the ohmic contact layer 153 makes ohmic contact with the second conductive semiconductor layer 130. Thus, since the second electrode layer 155 has electrical resistance different from that of the ohmic contact layer 153, the electric current applied to the second conductive semiconductor layer 130 can be distributed.

The ohmic contact layer 153 may comprise metal oxide or metal material having ohmic properties. When the second electrode layer 155 has ohmic and reflective characteristics, the ohmic contact layer 153 may be omitted.

The conductive support member 160 is formed under the second electrode layer 155. The conductive support member 160 may comprise copper, gold, nickel, molybdenum, copper-tungsten and carrier wafer such as Si, Ge, GaAs, ZnO and Sic. For example, the second electrode layer 155 may be formed using a sputtering method, and the conductive support member 160 may be formed using a plating method. The methods of forming the second electrode layer 155 and the conductive support member 160 can be modified with the scope of the embodiment.

Figure 7:
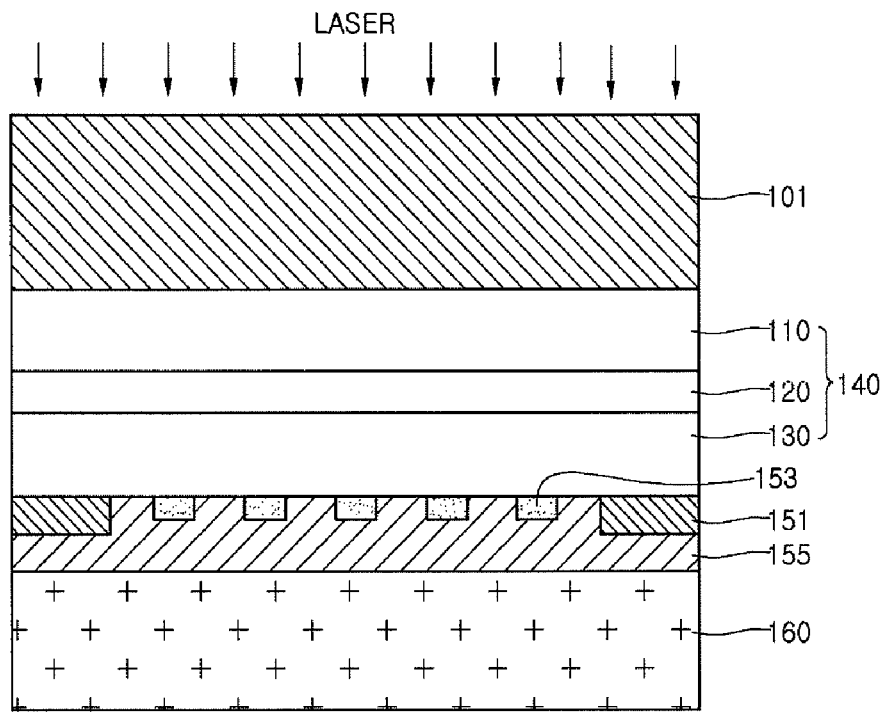

Referring to FIGS. 6 and 7, if the substrate 101 is turned over, the conductive support member 160 is located in place of a base. Then, the substrate 101 is removed.

For example, the substrate 101 can be removed through a laser lift off (LLO) process. According to the LLO process, as laser having a predetermined wavelength range is irradiated onto the substrate 101, thermal energy is concentrated on the interface between the substrate 101 and the first conductive semiconductor layer 110, so the substrate 101 is separated from the first conductive semiconductor layer 110.

The ohmic contact layer 153 reduces an impact applied between the second conductive semiconductor layer 130 and the second electrode layer 155 while the substrate 101 is being removed.

After the substrate 101 is removed, the first conductive semiconductor layer 110 is subject to a polishing process using inductively coupled plasma/reactive ion etching (ICP/RIE). The embodiment is not limited thereto.

Figure 8:
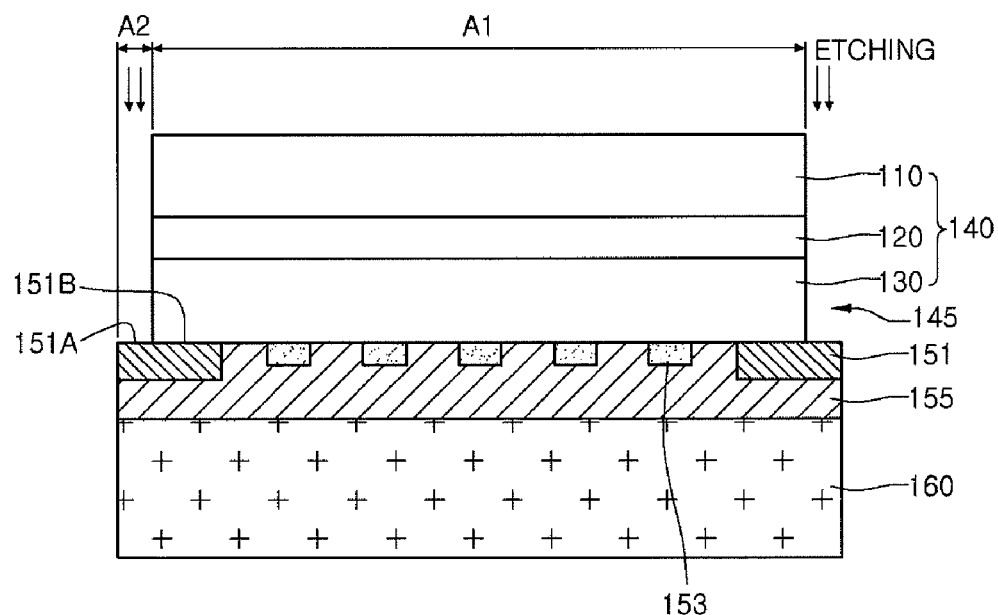

Referring to FIGS. 7 and 8, the mesa etching is performed relative to the channel area 145 on the first conductive semiconductor layer 110. The channel area 145 may correspond to ½ of the area L1 shown in FIG. 5. In detail, the boundary area L1 between the chips is etched, so that the channel area 145 or the non-light emitting area A2 can be formed in each chip.

The mesa etching is performed in such a manner that the transmissive conductive layer 151 or the second conductive semiconductor layer 130 is exposed through the first conductive semiconductor layer 110. The mesa etching may use dry etching and/or wet etching.

In the embodiment, the mesa etching uses the dry etching. In detail, light irradiated for the dry etching is irradiated onto the boundary area (L1 of FIG. 5) of the chip. Thus, the first conductive semiconductor layer 110, the active layer 120 and the second conductive semiconductor layer 130 are etched, so that the transmissive conductive layer 151 is exposed.

The light irradiated for the dry etching can reach the second electrode layer 155 by passing through the transmissive conductive layer 151. In such a case, a metal fragment is not generated in the second electrode layer 155. In detail, since the transmissive conductive layer 151 is not etched, the second electrode layer 155 is not affected by the light, so the short circuit does not occur in the interlayers of the light emitting structure 140.

If the transmissive conductive layer 151 is a $SiO_2$ layer, the $SiO_2$ layer is etched by the laser, so the second electrode layer 155 is exposed. In such a case, the second electrode layer 155 is melt, so that the short circuit may occur in the interlayers of the light emitting structure 140.

Since the transmissive conductive layer 151 comprises non-metal material or metal oxide, the laser passes through the transmissive conductive layer 151. Thus, the short circuit does not occur in the interlayers of the light emitting structure 140, so that the product yield can be improved and the electrical reliability of a device can be improved.

Further, the ohmic contact layer 153 reduces an impact applied between the second conductive semiconductor layer 130 and the second electrode layer 155.

Figure 9:
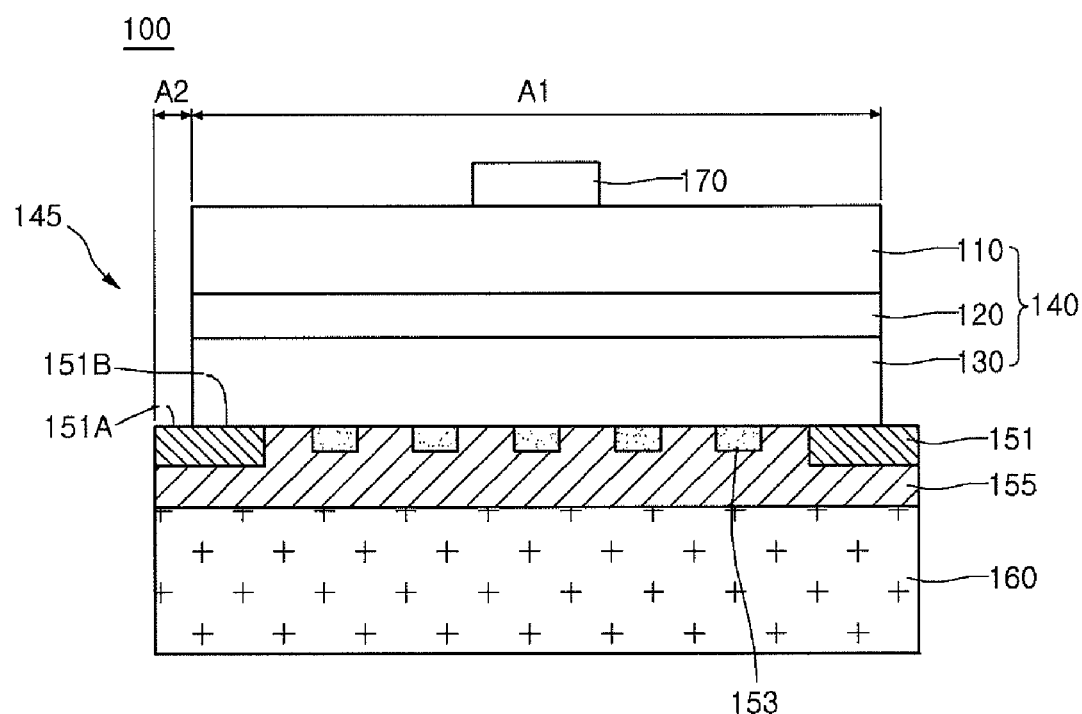

Referring to FIGS. 8 and 9, the first electrode layer 170 is formed on the first conductive semiconductor layer 110. The first electrode layer 170 can be formed in a predetermined pattern. The embodiment is not limited thereto. Further, the first conductive semiconductor layer 110 is provided thereon with a roughness surface, so that a critical angle of incident light can be changed. Thus, external quantum efficiency can be improved.

The sequence in which the first electrode 170 is formed and the mesa etching is performed can be modified. The embodiment is not limited thereto.

According to the embodiment, the transmissive conductive layer is formed on the outer interface between the compound semiconductor layer and the second electrode layer, so that the light emitting efficiency can be improved.

According to the embodiment, adhesive force between the compound semiconductor layer and the second electrode layer can be improved.

According to the embodiment, the transmissive conductive layer is disposed on the channel area of the compound semiconductor layer, so that the electrical reliability of the LED chip can be improved.

According to the embodiment, the second electrode layer making Schottky contact with the ohmic contact layer is formed under the compound semiconductor layer, so that electric current applied to the second electrode layer can be distributed.

According to the embodiment, the reliability of the semiconductor LED can be improved.

Although the embodiment has been made in relation to the compound semiconductor light emitting device comprising the N-P junction structure as an example, the compound semiconductor light emitting device comprising an N-P-N structure, a P-N structure or a P-N-P structure can be implemented. In the description of the embodiment, it will be understood that, when a layer (or film), a region, a pattern, or a structure is referred to as being "on (above/over/upper)" or "under (below/down/lower)" another substrate, another layer (or film), another region, another pad, or another pattern, it can be directly on the other substrate, layer (or film), region, pad or pattern, or intervening layers may also be present. Furthermore, it will be understood that, when a layer (or film), a region, a pattern, a pad, or a structure is referred to as being "between" two layers (or films), regions, pads or patterns, it can be the only layer between the two layers (or films), regions, pads, or patterns or one or more intervening layers may also be present. Thus, it should be determined by technical idea of the invention.

Any reference in this specification to "one embodiment," "an embodiment," "example embodiment," etc., means that a particular feature, structure, or characteristic described in connection with the embodiment is comprised in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A semiconductor light emitting device, comprising:
    a first electrode layer;
    a first conductive semiconductor layer doped with a first conductive dopant and disposed on the first electrode layer;
    an active layer on the first conductive semiconductor layer;
    a second conductive semiconductor layer doped with a second conductive dopant and disposed on the active layer;
    a second electrode layer on the second conductive semiconductor layer;
    a conductive layer on a peripheral portion of the second conductive semiconductor layer,
    wherein the conductive layer includes
        a first portion disposed between the second conductive semiconductor layer and the second electrode layer, and
        a second portion that extends from the first portion to outside of the second conductive semiconductor layer; and
    a conductive support member on the second electrode layer.

2. The semiconductor light emitting device of claim 1, wherein the conductive layer includes a light transmissive material.

3. The semiconductor light emitting device of claim 1, wherein the second conductive semiconductor layer is in ohmic contact with at least one of the conductive layer and the second electrode layer.

4. The semiconductor light emitting device of claim 1, wherein the second portion of the conductive layer extends to a sidewall of the second electrode layer.

5. The semiconductor light emitting device of claim 1, wherein the first conductive semiconductor layer includes a roughness surface thereon.

6. The semiconductor light emitting device of claim 4, wherein the second electrode layer contacts a vertical surface and a horizontal surface of the first portion of the conductive layer.

7. The semiconductor light emitting device of claim 1, wherein the conductive layer has a thickness thinner than a thickness of the second electrode layer.

8. The semiconductor light emitting device of claim 1, further comprising:
    an ohmic contact layer between the second conductive semiconductor layer and the second electrode layer.

9. The semiconductor light emitting device of claim 1, wherein the conductive layer includes a ring shape, a frame shape or a band shape along the peripheral portion of the second conductive semiconductor layer.

10. The semiconductor light emitting device of claim 1, wherein the second electrode layer includes reflective materials.

11. The semiconductor light emitting device of claim 1, wherein the conductive layer comprises at least one material selected from the group consisting of indium tin oxide (ITO), indium zinc oxide (IZO), aluminum zinc oxide (AZO), indium zinc tin oxide (IZTO), indium aluminum zinc oxide (IAZO), indium gallium zinc oxide (IGZO), indium gallium tin oxide (IGTO), and antimony tin oxide (ATO).

12. A semiconductor light emitting device, comprising:
    a first electrode layer;
    a first conductive semiconductor layer on the first electrode layer;
    an active layer on the first conductive semiconductor layer;
    a second conductive semiconductor layer on the active layer;
    a second electrode layer on second conductive semiconductor layer;
    a metal-based layer on a peripheral portion of the second conductive semiconductor layer and having a thickness thinner than a thickness of the second electrode layer; and
    a conductive support member on the second electrode layer
    wherein a portion of the metal-based layer protrudes from a side surface of the second conductive semiconductor layer.

13. The semiconductor light emitting device of claim 12, wherein the second electrode layer is surrounded by the metal-based layer.

14. The semiconductor light emitting device of claim 12, wherein the metal-based layer comprises a metal oxide.

15. The semiconductor light emitting device of claim 12, wherein the second electrode layer contacts a vertical surface and a horizontal surface of the metal-based layer.

* * * * *